(12) United States Patent
Moon

(10) Patent No.: US 7,981,762 B2
(45) Date of Patent: Jul. 19, 2011

(54) METHOD OF FORMING PRE-METAL DIELECTRIC LAYER OF SEMICONDUCTOR DEVICE

(75) Inventor: Sang-Tae Moon, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 840 days.

(21) Appl. No.: 11/947,514

(22) Filed: Nov. 29, 2007

(65) Prior Publication Data

US 2008/0135986 A1 Jun. 12, 2008

(30) Foreign Application Priority Data

Dec. 11, 2006 (KR) .................. 10-2006-0125584

(51) Int. Cl.
*H01L 21/00* (2006.01)
(52) U.S. Cl. .......... 438/401; 257/E23.179; 257/E21.525
(58) Field of Classification Search .................. 257/797; 438/401
See application file for complete search history.

(56) References Cited

U.S. PATENT DOCUMENTS

| 5,578,519 | A | * | 11/1996 | Cho .............................. 438/401 |
| 6,232,200 | B1 | * | 5/2001 | Chu .............................. 438/401 |
| 6,303,458 | B1 | * | 10/2001 | Zhang et al. ................... 438/401 |
| 6,337,262 | B1 | * | 1/2002 | Pradeep et al. ................ 438/574 |
| 6,440,816 | B1 | * | 8/2002 | Farrow et al. ................. 438/401 |
| 6,673,635 | B1 | * | 1/2004 | Hellig et al. ...................... 438/7 |
| 6,716,691 | B1 | * | 4/2004 | Evans et al. ................... 438/218 |
| 7,381,508 | B2 | * | 6/2008 | Kang et al. ...................... 430/22 |
| 7,723,203 | B2 | * | 5/2010 | Kim .............................. 438/401 |
| 2001/0039099 | A1 | * | 11/2001 | Coronel et al. ............... 438/418 |
| 2005/0031995 | A1 | * | 2/2005 | Kang et al. .................... 430/311 |
| 2006/0103035 | A1 | | 5/2006 | Maruyama |

* cited by examiner

*Primary Examiner* — Evan Pert
(74) *Attorney, Agent, or Firm* — Sherr & Vaughn, PLLC

(57) ABSTRACT

A method of forming a pre-metal dielectric (PMD) layer of a semiconductor device using a chemical mechanical polishing (CMP) process which can be suitable for easily recognizing an alignment key. Such a method can reduce or otherwise eliminate alignment key erosion due to CMP by previously forming an alignment key pattern of polysilicon in an active region of a semiconductor scribe lane.

16 Claims, 6 Drawing Sheets

METHOD OF FORMING PRE-METAL DIELECTRIC LAYER OF SEMICONDUCTOR DEVICE

The present application claims priority under 35 U.S.C. 119 to Korean Patent Application No. 10-2006-0125584 (filed on Dec. 11, 2006) which is hereby incorporated by reference in its entirety.

BACKGROUND

Aspects of semiconductor fabrication have focused on providing highly integrated semiconductor devices. Such semiconductor devices may include metal wirings on a circuit having a micro line width whereby the distance between the lines also becomes small. In order to reduce the size of the devices, a multi-layered wiring structure may be required. The multi-layered wirings may require a pre-metal dielectric (PMD) layer for providing electrical insulation between the metal lines.

The PMD layer for providing electrical isolation between the metal wirings may be formed by depositing undoped silicate glass (USG), TEOS or silicon nitride ($SiH_4$) using a plasma enhanced chemical vapor deposition (PE-CVD) method. The PMD layer may alternatively be formed by depositing silicon oxide ($SiO_2$) using a high density plasma (HDP CVD) method. The PMD layer may then be polished using a CMP process.

Figure 1A:
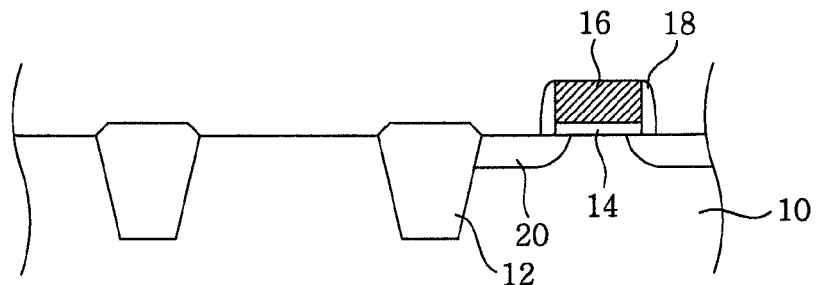

As illustrated in example FIG. 1A, isolation layers 12 defining an active region and an inactive region may be formed in silicon semiconductor substrate 10. Isolation layers 12 may be formed by etching semiconductor substrate 10 to a predetermined depth to form trenches. The trenches may be gap-filled with insulating material, such as an HDP oxide layer. The insulating material may then be polished using a CMP process to form shallow trench isolation (STI)-type isolation layers 12.

An insulating layer composed of $SiO_2$ may be deposited having a thickness of approximately 100 Å on and/or over the entire uppermost surface of semiconductor substrate 10 in which isolation layers 12 are formed. A gate conductive layer composed of doped polysilicon into which an impurity has been doped, may be deposited to a thickness of approximately 3000 Å on and/or over the insulating layer. The gate conductive layer can be composed of at least one of silicon germanium (SiGe), cobalt (Co), tungsten (W), titanium (Ti), nickel (Ni), tantalum (Ta), titanium nitride (TiN), tantalum nitride (TaN), and tungsten nitride (WN), or a composite thereof and doped polysilicon.

A photolithographic process may be performed to form a photoresist pattern defining a gate region in the gate conductive layer. A dry etch, such as reactive ion etching (RIE), may be performed on the gate conductive layer exposed by the pattern, thus forming gate electrode 16. A dry etch may also be performed on the underlying insulating layer to form gate insulating layer 14. The photoresist pattern may then be removed using an ashing process.

A low-concentration ion implantation process using an n-type dopant of a low concentration, may be performed by using gate electrode 16 as an ion implant mask, thus forming a lightly doped drain (LDD) region.

An insulating material composed of at least one of SiN and SiON, may be deposited over the entire uppermost surface of semiconductor substrate 10. A dry etch such as RIE may be performed on the insulating material to form a pair of spacers 18 on the sidewalls of gate electrode 16.

A high-concentration ion implantation process using an n-type dopant of a low concentration, may be performed using gate electrode 16 and spacers 18 as an ion implant mask, thus forming source/drain regions 20.

Figure 1B:
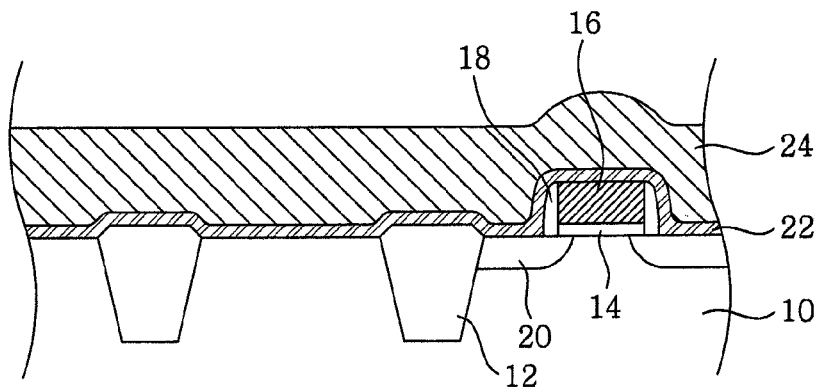

As illustrated in example FIG. 1B, etch-stop layer 22 composed SiN may be deposited having a thickness of between approximately 300 to 500 Å on and/or over the entire surface of the resultant semiconductor substrate structure in which a MOS transistor including gate electrode 16 and source/drain regions 20, is formed. Etch-stop layer 22 may serve to protect the underlying MOS transistor from infiltration of moving ions, moisture, etc. when subsequent processes are carried out, and also to stop etching with a high etch selectivity at the time of a contact formation process.

An insulating layer including first PMD layer 24 may be thickly deposited having a thickness of approximately 7000 Å or more on and/or over etch-stop layer 22. First PMD layer 24 may be composed of at least one of an $O_3$-TEOS oxide layer, a BPSG insulating layer and a HDP CVD oxide layer having a good gap-fill characteristic. First PMD layer 24 may serve to gap-fill the space between the underlying semiconductor devices.

Figure 1C:
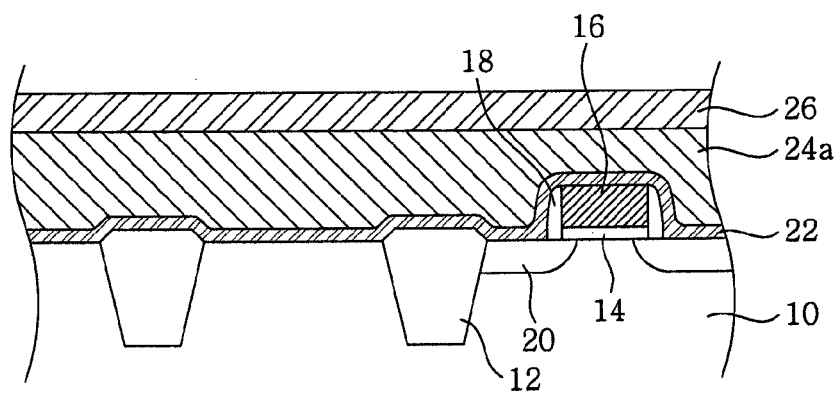

As illustrated in example FIG. 1C, a CMP process may be performed on first PMD layer 24 in order to polish the surface thereof, resulting in polished PMD layer 24a. Thereafter, a TEOS oxide layer composed of second PMD layer 26, may be deposited on and/or over polished first PMD layer 24a to a thickness of between 1000 to 2000 Å. Second PMD 26 may serve to cure the surface of the insulating layer, which is degraded by the CMP process of first PMD layer 24.

Figure 1D:
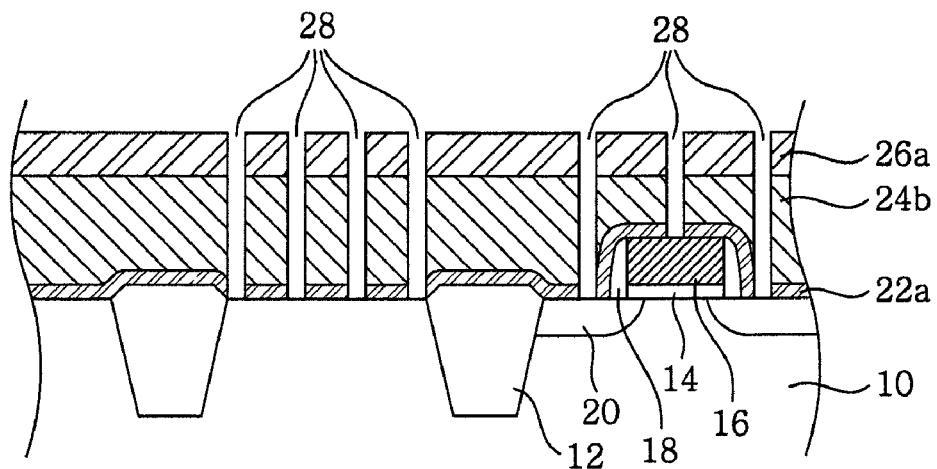

As illustrated in example FIG. 1D, a photolithographic process may be performed on second PMD 26, thus forming a photoresist pattern defining a contact region. A dry etch may be performed on etch-stop layer 22, first PMD layer 24a and second PMD layer 26, which are exposed by the photoresist pattern, to form a plurality of contact holes 28 which exposes the uppermost surface of source/drain regions 20. The photoresist pattern may then be removed by an ashing process. Reference numerals 22a, 24b, and 26a designate the etch-stop layer, the first PMD layer, and the second PMD layer, respectively, after formation of contact holes 28 using the dry etch.

Figure 1E:
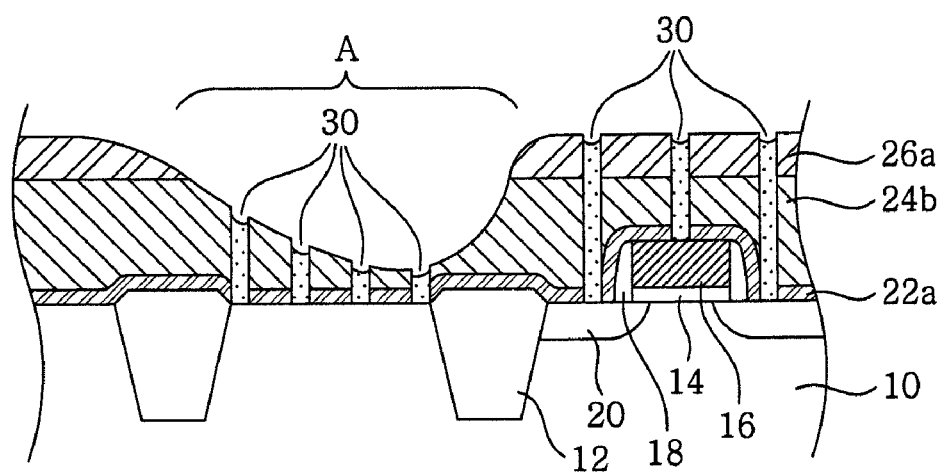

As illustrated in example FIG. 1E, a conductive layer may be deposited to gap-fill contact holes 28. The conductive layer on and/or over the surface of second PMD layer 26a may be removed using a CMP process to form a plurality of contacts 30 vertically and electrically connected to source/drain regions 20. The conductive layer constituting contacts 30 can be composed of doped polysilicon, tungsten (W) or the like.

In the formation process of the PMD layers of the semiconductor device, if the contact holes are formed in the thin PMD, tungsten (W) may be deposited, and tungsten CMP may then be performed, erosion may occur in the alignment key pattern region "A." This is due to the thickness of an insulating layer, such as PMD, is not sufficiently thick in terms of device characteristics. If the alignment key pattern "A" cannot be recognized, further processes cannot be performed.

SUMMARY

Embodiments relate to a method of forming a pre-metal dielectric (PMD) layer of a semiconductor device using a chemical mechanical polishing (CMP) process which can be suitable for easily recognizing an alignment key.

Embodiments relate to a method of forming PMD layers of a semiconductor device which can reduce or otherwise eliminate alignment key erosion due to CMP by previously forming an alignment key pattern of polysilicon in an active region of a semiconductor scribe lane.

Embodiments relate to a method of forming a semiconductor device in which an alignment key pattern can be easily recognized although a CMP process is carried out, by forming the alignment key pattern in an STI region of a semiconductor device.

In accordance with embodiments, a method of forming a PMD layer in a semiconductor device can include at least one of the following steps: providing a semiconductor substrate having a semiconductor device; forming an etch-stop layer over the semiconductor substrate; forming a plurality of alignment key patterns composed of polysilicon over the etch-stop layer in an active region of a scribe lane of the semiconductor substrate; forming a first PMD layer over the semiconductor substrate including the etch-stop layer and the alignment key patterns; forming a second PMD layer over the semiconductor substrate including the first PMD layer; and then forming a plurality of contacts against sidewalls of the plurality of alignment patterns.

In accordance with embodiments, a method of a semiconductor device can include at least one of the following steps: providing a semiconductor substrate having a semiconductor device; forming at least one STI-type isolation layer in the semiconductor substrate; and then forming an alignment key pattern region in the STI isolation layer.

In accordance with embodiments, a semiconductor device can include an STI isolation region formed in a semiconductor substrate in which the semiconductor device is formed; at least one PMD layer formed over the semiconductor substrate including the at least one STI isolation layer; and an alignment key region comprising an active region of a scribe lane of the semiconductor substrate formed the STI isolation region.

DRAWINGS

Example FIGS. 1A to 1E illustrate a method of forming PMD layers and contacts in a semiconductor device.

Example FIGS. 2 to 3 illustrate a method of forming PMD layers and contacts in a semiconductor device, in accordance with embodiments.

DESCRIPTION

Figure 2A:
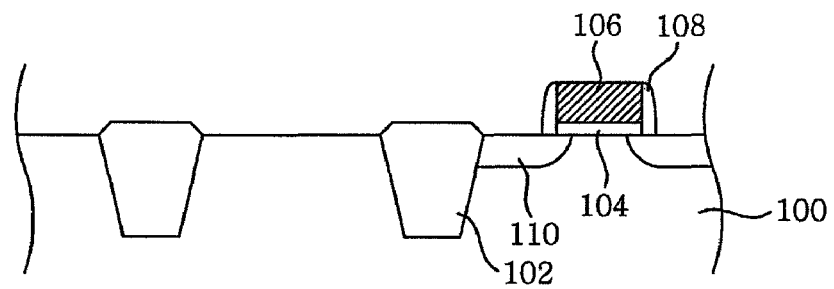

As illustrated in example FIG. 2A, a plurality of isolation layers 102 defining an active region and an inactive region can be formed in silicon semiconductor substrate 100. Isolation layers 102 can be formed by etching semiconductor substrate 100 to a predetermined depth to form a plurality of trenches. The trenches can be gap-filled with an insulating material such as an HDP oxide layer. The insulating material can be polished using a CMP process to form STI-type isolation layers 102.

An insulating layer, such as $SiO_2$, can be deposited having a thickness of approximately 100 Å on and/or over the entire surface of semiconductor substrate 100 including isolation layers 102. A gate conductive layer composed of doped polysilicon can be deposited having a thickness of approximately 3000 Å on and/or over the insulating layer. The gate conductive layer can be composed of at least one of doped polysilicon, SiGe, Co, W, Ti, Ni, Ta, TiN, TaN, WN and any composite thereof.

A photolithographic process can be performed to form a photoresist pattern defining a gate region in the gate conductive layer. A dry etch such as RIE, can be performed on the gate conductive layer exposed by the pattern, thus forming gate electrode 106. A dry etch can also be performed on the underlying insulating layer to form gate insulating layer 104. The photoresist pattern can be removed using an ashing process.

An LDD region can be formed by performing a low-concentration ion implantation process of an n-type dopant of a low concentration, using gate electrode 106 as an ion implant mask.

An insulating material composed of at least one of SiN and SiON can be deposited on and/or over the entire surface of the semiconductor substrate 100. A dry etch such as RIE can be performed on the insulating material to form a plurality of spacers 108 on sidewalls of gate electrode 106.

Source/drain regions 110 adjacent to gate electrode 106 can be formed by performing a high-concentration ion implantation process of an n-type dopant of a low concentration using spacers 108 and gate electrode 106 as an ion implant mask.

Figure 2B:
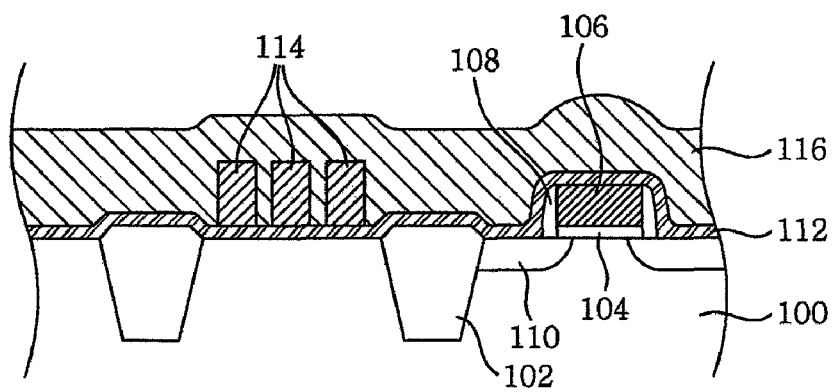

As illustrated in example FIG. 2B, etch-stop layer 112 can be deposited having a thickness of between 300 to 500 Å on and/or over the entire surface of the semiconductor substrate structure including gate electrode 106 and source/drain regions 110. Etch-stop layer 112 can be composed of SiN and can serve to protect the underlying semiconductor device from the infiltration of moving ions, moisture, etc. when subsequent processes are carried out, and to also to stop etching with a high etch selectivity at the time of a contact formation process.

A plurality of alignment key-shaped polysilicon patterns 114 can then be formed on and/or over etch-stop layer 112 in the active region of semiconductor substrate 100. Forming polysilicon patterns 114 in an alignment key structure can be advantageous for reducing erosion of the alignment key pattern region which may occur in subsequent CMP processes. Essentially, since polysilicon patterns 114 can have a removal rate which is relatively lower than that of a subsequent first PMD layer, erosion of the alignment key patterns can be reduced.

After formation of polysilicon patterns, an insulating layer such as a first pre-metal dielectric (PMD layer 116 can be thickly deposited having a thickness of approximately 7000 Å or more on and/or over etch-stop layer 112 including polysilicon patterns 114. First PMD layer 116 can be composed of a material having good gap-fill characteristics, such as at least one of $O_3$-TEOS oxide, BPSG insulating material and HDP CVD oxide. First PMD layer 116 can serve to gap-fill the space between the underlying semiconductor devices.

Figure 2C:
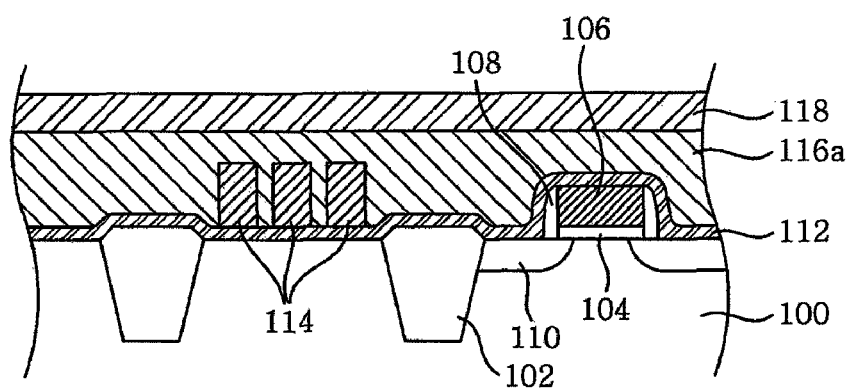

As illustrated in example FIG. 2C, a CMP process can be performed on first PMD layer 116 in order to polish the surface thereof, resulting in polished first PMD layer 116b. Second PMD layer 118, can be deposited on and/or over polished first PMD layer 116a having a thickness of between approximately 1000 to 2000 Å. Second PMD layer 118 can be composed of a TEOS oxide layer. Second PMD layer 118 can serve to cure the surface of the insulating layer which is degraded by the CMP process of first PMD layer 116.

Figure 2D:
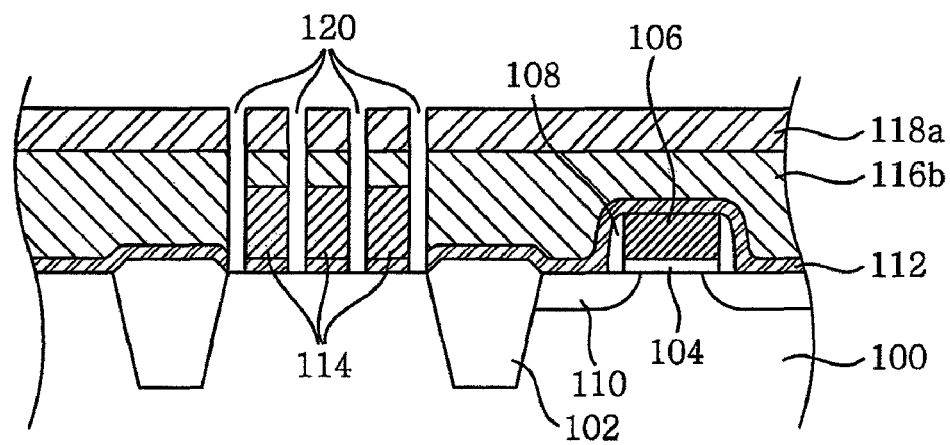

As illustrated in example FIG. 2D, a photolithographic process can be performed on second PMD layer 118 to form a photoresist pattern defining a contact region. A plurality of contact holes 120 exposing the uppermost surface of semiconductor substrate 100 can be formed by performing a dry etch on second PMD layer 118, polished first PMD layer 116a and etch-stop layer 112, which are exposed by the photoresist pattern. The photoresist pattern can then be removed using an ashing process. Reference numerals 116b and 118a designate the first PMD layer and the second PMD layer, respectively, after contact holes 120 are formed using the dry etch.

Figure 2E:
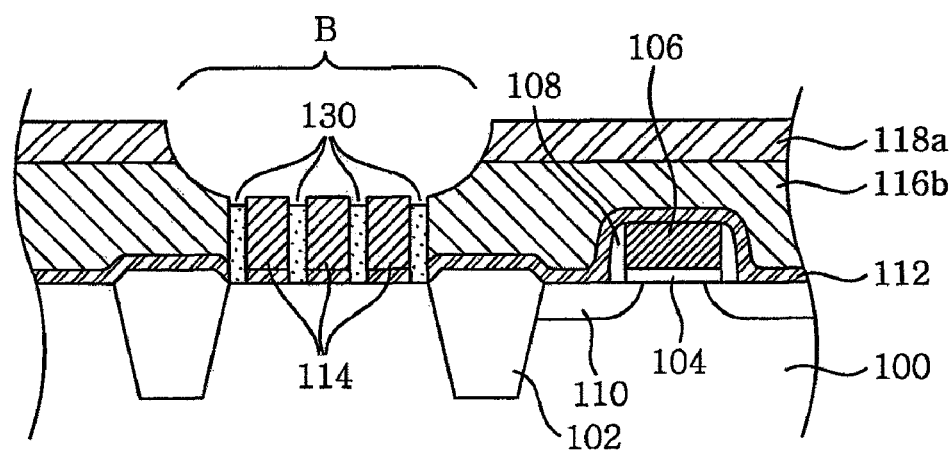

As illustrated in example FIG. 2E, a conductive layer can be deposited to gap-fill contact holes 120. A plurality of contacts 130 can be formed by removing portions of the conductive layer, i.e., contacts 130 provided vertically above alignment key patterns 114 using a CMP process. Contacts 130 can be vertically connected to source/drain regions 110 and STI type isolation layers 102. Conductive layer including contacts 130 can be composed of polysilicon into which an impurity has been doped, such as tungsten (W) or the like.

Alignment key pattern region "B" is rarely eroded by the polysilicon patterns 114 although a CMP process is performed, because polysilicon patterns 114, which have a removal rate which is relatively lower than that of first PMD layer 116, are previously formed in an alignment key shape.

Figure 3A:
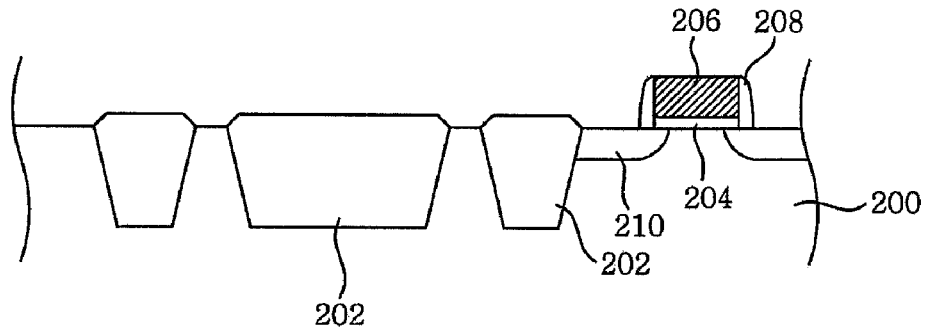

As illustrated in example FIG. 3A, a plurality of device isolation layers 202 defining an active region and an inactive region can be formed in silicon semiconductor substrate 200. Isolation layers 202 can be formed by etching semiconductor substrate 200 to a predetermined depth to form a plurality of trenches therein. The trenches can be gap-filled with an insulating material such as an HDP oxide layer. The insulating material can be polished using a CMP process, thus forming STI-type isolation layer 202.

An insulating layer, such as $SiO_2$, can be deposited on and/or over the entire surface of semiconductor substrate 200 including isolation layers 202. The insulating layer can have a thickness of approximately 100 Å. A gate conductive layer composed of a doped polysilicon into which an impurity has been doped, can be deposited on and/or over the insulating layer. The gate conductive layer can have a thickness of approximately 3000 Å and be composed of at least one of SiGe, Co, W, Ti, Ni, Ta, TiN, TaN, WN, composites thereof and doped polysilicon.

A photolithographic process can be performed to form a photoresist pattern defining a gate region in the gate conductive layer. A dry etch such as RIE, can then be performed on the gate conductive layer exposed by the photoresist pattern to form gate electrode 206. A second dry etch can also be performed on the underlying insulating layer to form gate insulating layer 204. The photoresist pattern can then be removed using an ashing process.

A low-concentration ion implantation process using an n-type dopant of a low concentration, can be performed using gate electrode 206 as an ion implant mask, thus forming an LDD region.

Insulating material composed of at least one of SiN and SiON, can be deposited on and/or over the entire surface of semiconductor substrate 200. A dry etch such as RIE can then be performed on the insulating material to form spacers 208 on the sidewalls of gate electrode 206.

A high-concentration ion implantation process using an n-type dopant of a low concentration, can be performed using spacers 208 and gate electrode 206 as ion implant masks to form source/drain regions 210.

Figure 3B:
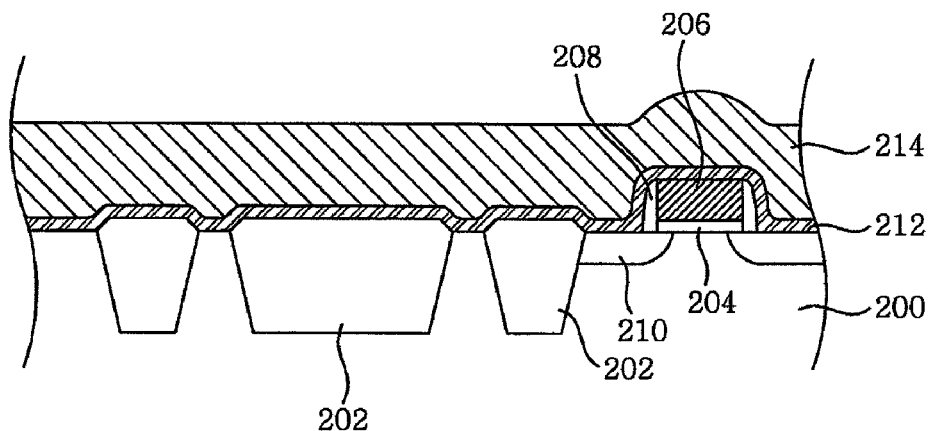

As illustrated in example FIG. 3B, etch-stop layer 212 can be formed on and/or over semiconductor substrate 200 having a MOS transistor including gate electrode 206, spacers 208 and source/drain regions 210. Etch-stop layer 212 can be composed of SiN having a thickness of between 300 to 500 Å. Etch-stop layer 212 can serve to protect the underlying semiconductor device from the infiltration of moving ions, moisture, etc. when subsequent processes are carried out and also to stop etching with a high etch selectivity at the time of a contact formation process.

An insulating layer, first PMD layer 214 can be formed on and/or over semiconductor substrate 200 including etch-stop layer 212. First PMD layer 214 can be composed of a material exhibiting a good gap-fill characteristic, such as at least one of $O_3$-TEOS oxide, BPSG insulating material and HDP CVD oxide. First PMD layer 214 may have a thickness of approximately 7000 Å or more. First PMD 214 can serve to gap-fill the space between the underlying semiconductor devices.

Figure 3C:
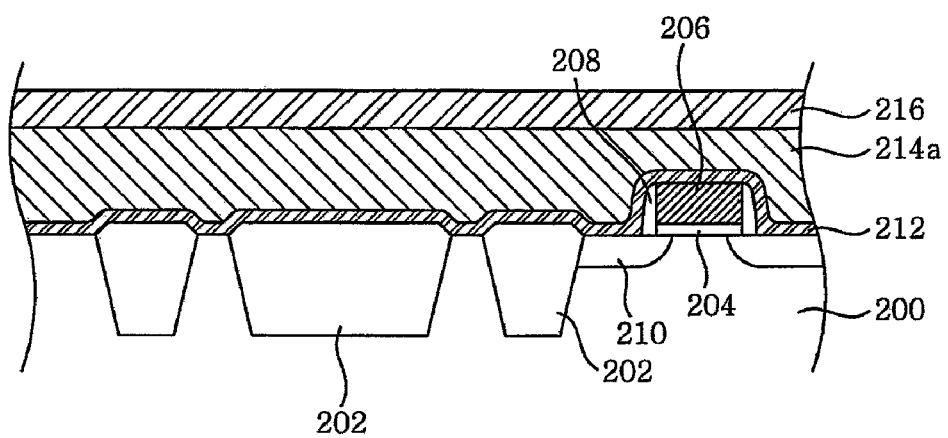

As illustrated in example FIG. 3C, a CMP process can be performed on first PMD layer 214 in order to obtain polished first PMD layer 214b. Second PMD layer 216, can be deposited on and/or over polished first PMD layer 214b. Second PMD layer 216 can be composed of a TEOS oxide layer. Second PMD layer 216 can serve to cure the surface of the insulating layer which is degraded by the CMP process of first PMD layer 214.

Figure 3D:
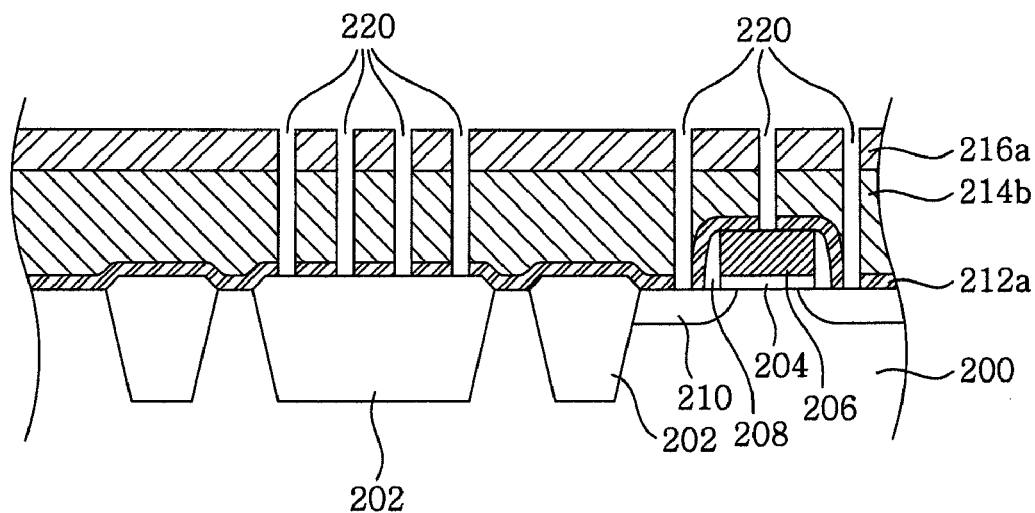

As illustrated in example FIG. 3D, a photolithographic process can be performed on second PMD 216, thus forming a photoresist pattern defining a contact region. A dry etch can be performed on second PMD 216, first PMD 214b, and etch-stop layer 212 which are exposed by the photoresist pattern to form a plurality of contact holes 220 through which the uppermost surfaces of STI type isolation layers 202 and source/drain regions 210 can be exposed. The photoresist pattern can then be removed using an ashing process. Reference numerals 212a, 214b and 216a designate the etch-stop layer, the first PMD layer, and the second PMD layer, respectively, after formation of contact holes 220 using the dry etch. In order to form subsequent alignment key patterns, contact holes 220 can be formed within one of the plurality of STI type isolation layers 202.

Figure 3E:
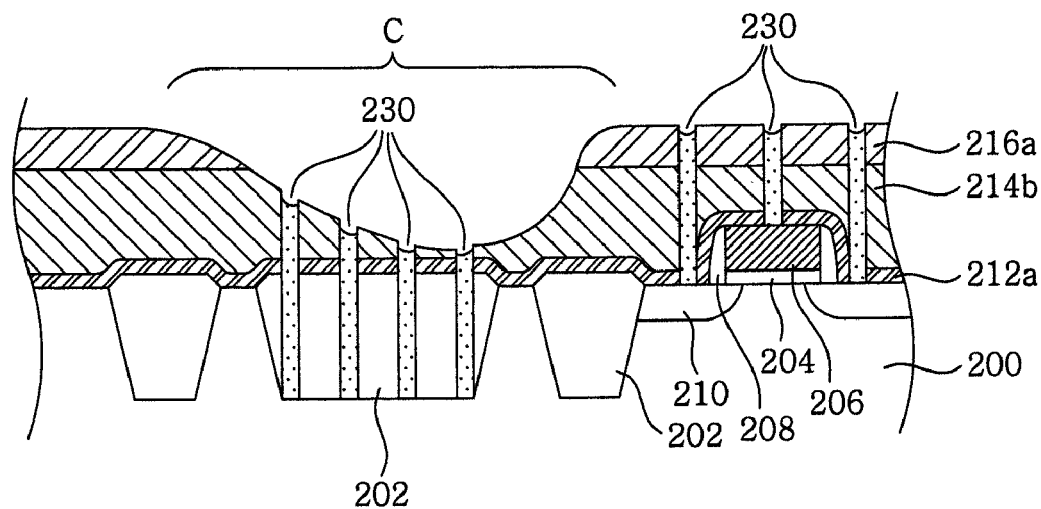

As illustrated in example FIG. 3E, a conductive layer can be deposited to gap-fill contact holes 220. A plurality of contacts 230 can be formed by removing portions of the conductive layer, i.e., contacts 230, provided above the uppermost surface of first PMD layer 214b using a CMP process. Contacts 230 can be vertically connected to source/drain regions 210 and STI type isolation layers 202. The conductive layer including contacts 230 can be composed of doped polysilicon into which an impurity of a metal such as tungsten has been doped. Accordingly, formation of alignment key patterns "C" can be formed in STI-type isolation layers 202 region.

In accordance with embodiments, because the alignment key patterns constituting the active region of the scribe lane can be formed in the STI region, alignment key recognition can be facilitated. Since the alignment key patterns of the active region can be composed of a material such as polysilicon, erosion of the alignment key patterns due to subsequent CMP processes can be prevented.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A method comprising:
providing a semiconductor substrate having a semiconductor device;
forming an etch-stop layer over the semiconductor substrate;

forming a plurality of alignment key patterns composed of polysilicon over the etch-stop layer in an active region of a scribe lane of the semiconductor substrate;

forming a first PMD layer over the semiconductor substrate including the etch-stop layer and the alignment key patterns;

forming a second PMD layer over the semiconductor substrate including the first PMD layer; and then forming a plurality of contacts against sidewalls of the plurality of alignment patterns.

2. The method of claim 1, wherein forming the etch-stop layer comprises:

depositing a SiN layer having a thickness of between 300 to 500Å over the semiconductor substrate.

3. The method of claim 1, wherein forming the first PMD layer comprises:

depositing a TEOS oxide layer having a thickness of between over the semiconductor substrate including the first PMD layer.

4. The method of claim 1, wherein the plurality of alignment key patterns have a removal rate lower than the removal rates of the first PMD layer and the second PMD layer.

5. A method comprising: forming at least one STI-type isolation layer in a semiconductor substrate; and forming an alignment key pattern in the STI isolation layer, wherein forming the alignment key pattern comprises:

forming an etch-stop layer over the semiconductor substrate including the at least one STI isolation layer;

forming an insulating layer over the semiconductor substrate including the etch-stop layer;

forming an oxide layer over the first insulating layer;

forming a plurality of contact holes in the at least one STI isolation layer; and then forming a contact in each of the plurality of contact holes.

6. The method of claim 5, wherein the etch-stop layer comprises SiN.

7. The method of claim 6, wherein the etch-stop layer has a thickness of between 300 to 500Å.

8. The method of claim 5, wherein the insulating layer has a thickness of approximately 7000Å or more.

9. The method of claim 8, wherein the insulating layer comprises a pre-metal dielectric material.

10. The method of claim 9, wherein the pre-metal dielectric material comprises at least one of $O_3$-TEOS oxide, BPSG insulating material and HDP CVD oxide.

11. The method of claim 5, wherein the oxide layer comprises a pre-metal dielectric material.

12. The method of claim 11, wherein the pre-metal dielectric material comprises a TEOS oxide.

13. The method of claim 6, wherein forming the plurality of contact holes comprises performing a dry etch on the etch-stop layer, the insulating layer and the oxide layer.

14. The method of claim 5, wherein forming the contacts comprises gap-filling a conductive layer in each one of the plurality of contact holes.

15. The method of claim 14, wherein the conductive layer comprises a polysilicon material doped with an impurity of a metal.

16. The method of claim 15, wherein the polysilicon material is doped with the impurity of tungsten.

* * * * *